US008928430B2

(12) United States Patent
Song

(10) Patent No.: US 8,928,430 B2
(45) Date of Patent: Jan. 6, 2015

(54) IMPEDANCE MATCHING APPARATUS AND METHOD OF ANTENNA CIRCUIT

(75) Inventor: Ju Young Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 595 days.

(21) Appl. No.: 13/173,717

(22) Filed: Jun. 30, 2011

(65) Prior Publication Data

US 2012/0007692 A1  Jan. 12, 2012

(30) Foreign Application Priority Data

Jul. 6, 2010 (KR) ........................ 10-2010-0064892

(51) Int. Cl.
*H03H 7/38* (2006.01)
*H03H 7/40* (2006.01)
(52) U.S. Cl.
CPC ..................................... *H03H 7/40* (2013.01)
USPC ............................ 333/129; 333/132; 333/126
(58) Field of Classification Search
USPC ........................... 333/129, 124–128, 132, 134
See application file for complete search history.

(56) References Cited

U.S. PATENT DOCUMENTS

| 5,589,844 | A | 12/1996 | Belcher et al. |
| 2005/0026573 | A1 | 2/2005 | Cho |
| 2008/0316948 | A1* | 12/2008 | Knecht et al. ................. 370/294 |
| 2010/0007331 | A1* | 1/2010 | Hawkins et al. ................ 324/98 |
| 2012/0249259 | A1* | 10/2012 | Keese et al. ..................... 333/32 |

FOREIGN PATENT DOCUMENTS

CN          1585281 A       2/2005

OTHER PUBLICATIONS

Office Action dated Nov. 11, 2013 in Chinese Application No. 201110196545.0, filed Jul. 5, 2011.

\* cited by examiner

*Primary Examiner* — Robert Pascal
*Assistant Examiner* — Kimberly Glenn
(74) *Attorney, Agent, or Firm* — Saliwanchik, Lloyd & Eisenschenk

(57) ABSTRACT

An impedance matching apparatus is provided. The impedance matching apparatus includes a signal separation unit, an impedance detection unit, and an impedance matching unit. The signal separation unit separates a transmission and reception signal, and selectively passes a desired frequency corresponding to the transmission and reception signal. The impedance detection unit includes a plurality of impedances, and detects first and second electric potentials between the impedances. The impedance matching unit compares the first and second electric potentials detected by the impedance detection unit, and changes a matching factor for one of the impedances included in the impedance detection unit to match the impedances according to the compared result.

13 Claims, 4 Drawing Sheets

IMPEDANCE MATCHING APPARATUS AND METHOD OF ANTENNA CIRCUIT

CROSS-REFERENCE TO RELATED APPLICATION

This application claims the benefit under 35 U.S.C. §119 of Korean Patent Application No. 10-2010-0064892, filed on 6 Jul., 2010, which is hereby incorporated by reference in its entirety.

BACKGROUND

In mobile communication terminals, an antenna circuit transmits or receives a certain radio wave signal through an antenna.

Impedance is required to be accurately matched such that the antenna has optimal transmission and reception radiation performance.

Therefore, the antenna circuit includes a capacitor and an inductor. The antenna circuit controls the value of the capacitor and the value of the inductor to match the impedances of the antenna in an optimal state.

In matching impedances, the impedances of an antenna are matched in a state where a mobile communication terminal is located in a free space.

Generally, a user uses a mobile communication terminal in a state where the user has held a body with its hand and brought a speaker into contact with its ear, or uses the mobile communication terminal by using an earphone in a state where the body of the communication terminal has been placed in a bag or a pocket.

Since a user uses a mobile communication terminal in a state where the user has held a body with its hand and brought a speaker into contact with its ear or uses the mobile communication terminal in a state where the body of the communication terminal has been placed in a bag or a pocket, the impedance matching factor of an antenna varies, and consequently, the transmission and reception radiation performance of the antenna with impedances matched in a free space is degraded.

Accordingly, mobile communication terminals include an adaptive tuning antenna circuit that allows an antenna to have optimal transmission and reception radiation performance by automatically controlling the impedances of the antenna when the impedance matching factor of the antenna is changed.

To optimally maintain the transmission and reception radiation performance of the antenna, the adaptive tuning antenna circuit is required to detect the changed impedance state of the antenna.

For this, the adaptive tuning antenna circuit includes a coupler, and detects a forward power and a reflected power outputted from the coupler.

In order to detect the reflected power and the forward power and control an impedance, however, the adaptive tuning antenna circuit is required to include the coupler and a plurality of power detectors for detecting the forward power and the reflected power outputted from the coupler.

BRIEF SUMMARY

Embodiments provide an antenna circuit having a new structure.

The object of the present invention is not limited to the aforesaid, but other objects not described herein will be clearly understood by those skilled in the art from descriptions below.

In one embodiment, an impedance matching apparatus includes: a signal separation unit separating a transmission and reception signal, and selectively passing a desired frequency corresponding to the transmission and reception signal; an impedance detection unit including a plurality of impedances, and detecting first and second electric potentials between the impedances; and an impedance matching unit comparing the first and second electric potentials detected by the impedance detection unit, and changing a matching factor for one of the impedances included in the impedance detection unit to match the impedances according to the compared result.

The impedance detection unit may include first to fourth impedances configuring a Wheatstone bridge circuit, one of the first to fourth impedances being an antenna matching end impedance.

The first electric potential may be an electric potential between the first and second impedances, and the second electric potential may be an electric potential between the third and fourth impedances.

The impedance detection unit may further include: a first detector disposed between the first and second impedances, and detecting the first electric potential; and a second detector disposed between the third and fourth impedances, and detecting the second electric potential.

At least one of the first to fourth impedances may include a variable capacitor.

The impedance matching unit may include: a controller detecting a difference between the first and second electric potentials, and determining an impedance matching factor corresponding to the detected difference; and a digital-to-analog converter (DAC) converting a signal, corresponding to the impedance matching factor determined by the controller, into an analog signal to output the converted analog signal.

The impedance matching factor may correspond to a capacitance value of the variable capacitor.

The impedance matching factor may correspond to an equipotential value for changing the difference between the first and second electric potentials to zero.

The transmission and reception signal may include a radio frequency (RF) transmission and reception signal.

The impedance matching apparatus may be built in a body of a wireless communication terminal including a tuner.

In another embodiment, an impedance matching method includes: detecting a first electric potential between first and second impedances; detecting a second electric potential between third and fourth impedances; comparing the detected first and second electric potentials; and changing an impedance matching factor for one of the first to fourth impedances according to the compared result.

At least one of the first to fourth impedances may include a variable capacitor.

The changing of an impedance matching factor may include changing a capacitance value of the variable capacitor for the first and second electric potentials to be equal, when the first and second electric potentials differ.

The impedance matching method may further include maintaining the impedance matching factor as-is, when the first and second electric potentials are equal.

The details of one or more embodiments are set forth in the accompanying drawings and the description below. Other features will be apparent from the description and drawings, and from the claims.

DETAILED DESCRIPTION

Figure 1:
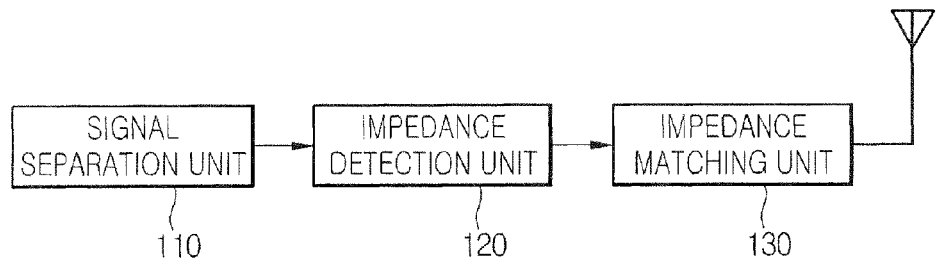
FIG. 1 is a block diagram schematically illustrating an impedance matching apparatus according to an embodiment.

Reference will now be made in detail to the embodiments of the present disclosure, examples of which are illustrated in the accompanying drawings.

Since the present disclosure may have diverse modified embodiments, specific embodiments are illustrated in the drawings and are described in detail.

However, this does not limit the present invention within specific embodiments and it should be understood that the present invention covers all the modifications, equivalents, and replacements within the idea and technical scope of the present invention.

It will be understood that although the terms of first and second are used herein to describe various elements, these elements should not be limited by these terms. Terms are only used to distinguish one component from other components. Therefore, a component referred to as a first component in one embodiment can be referred to as a second component in another embodiment. The word 'and/or' means that one or more or a combination of relevant constituent elements is possible.

Embodiments of the present invention will be described below in more detail with reference to the accompanying drawings. For convenience of description and clarity, like reference numerals denote like elements throughout.

Figure 2:
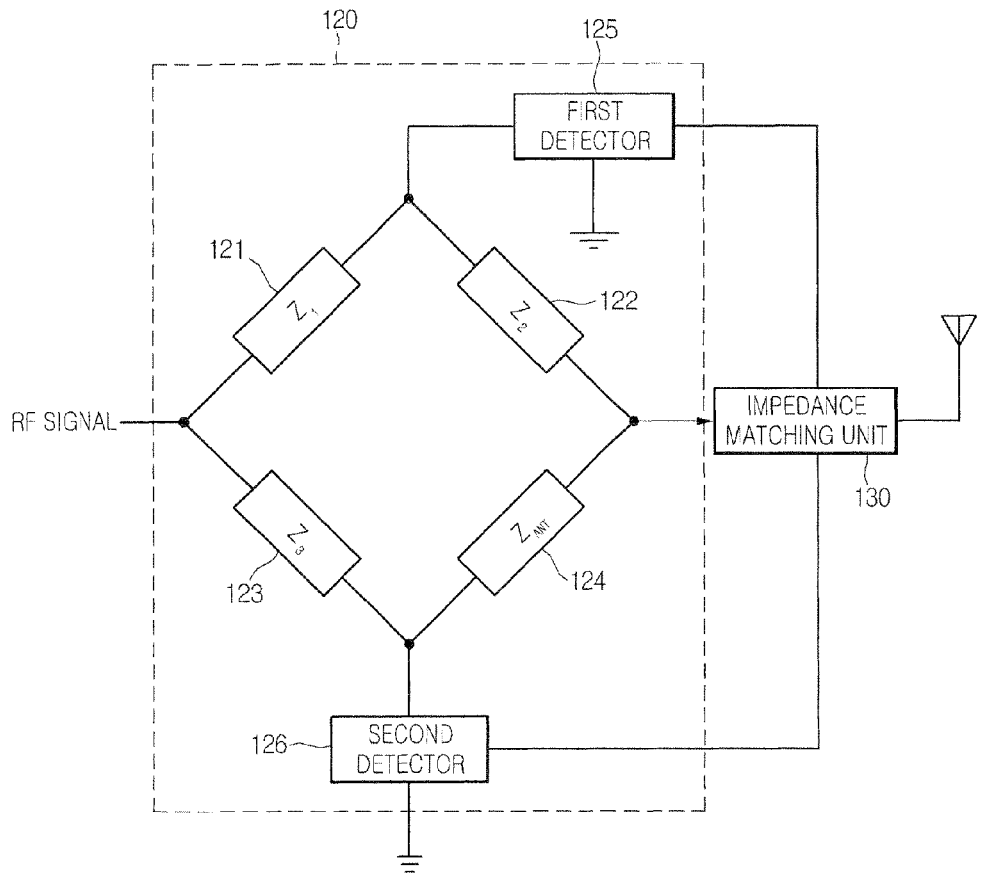
FIG. 2 is a detailed block diagram illustrating an impedance detection unit of FIG. 1.
Figure 3:
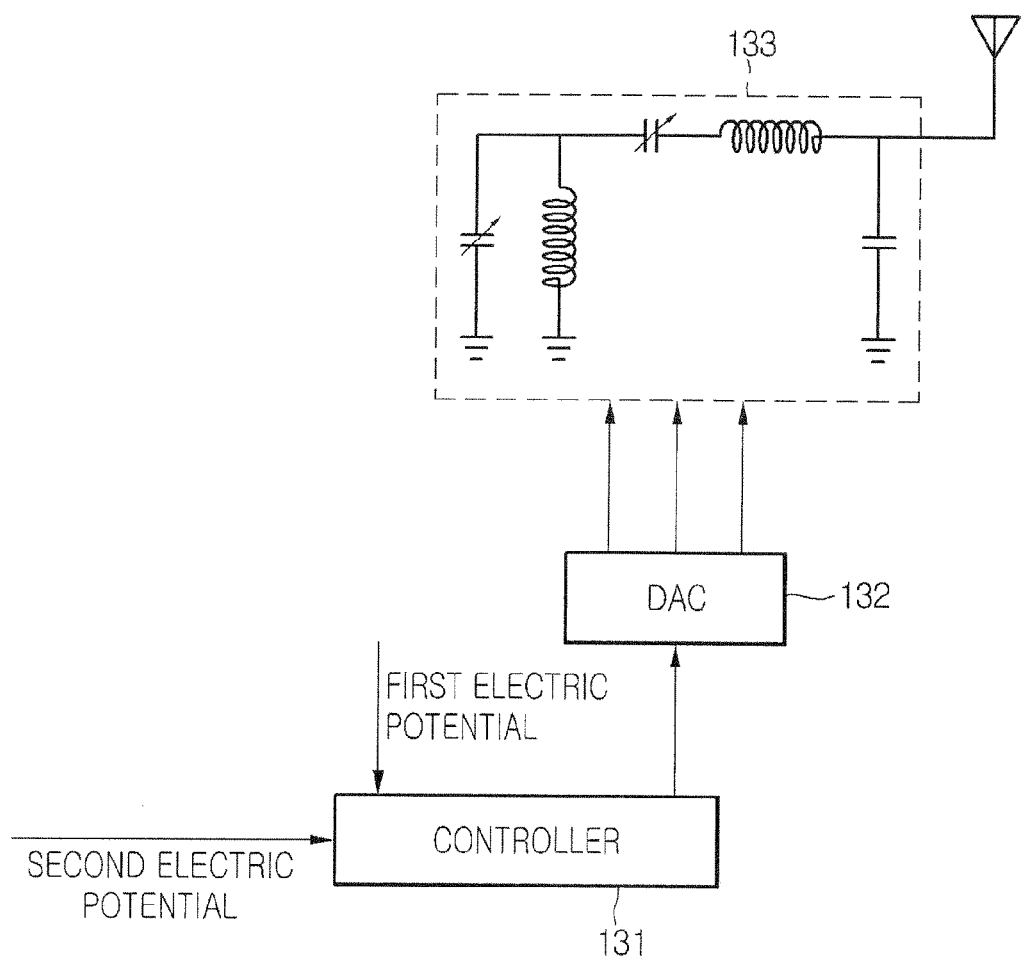
FIG. 3 is a detailed block diagram illustrating an impedance matching unit according to a first embodiment.
Figure 4:
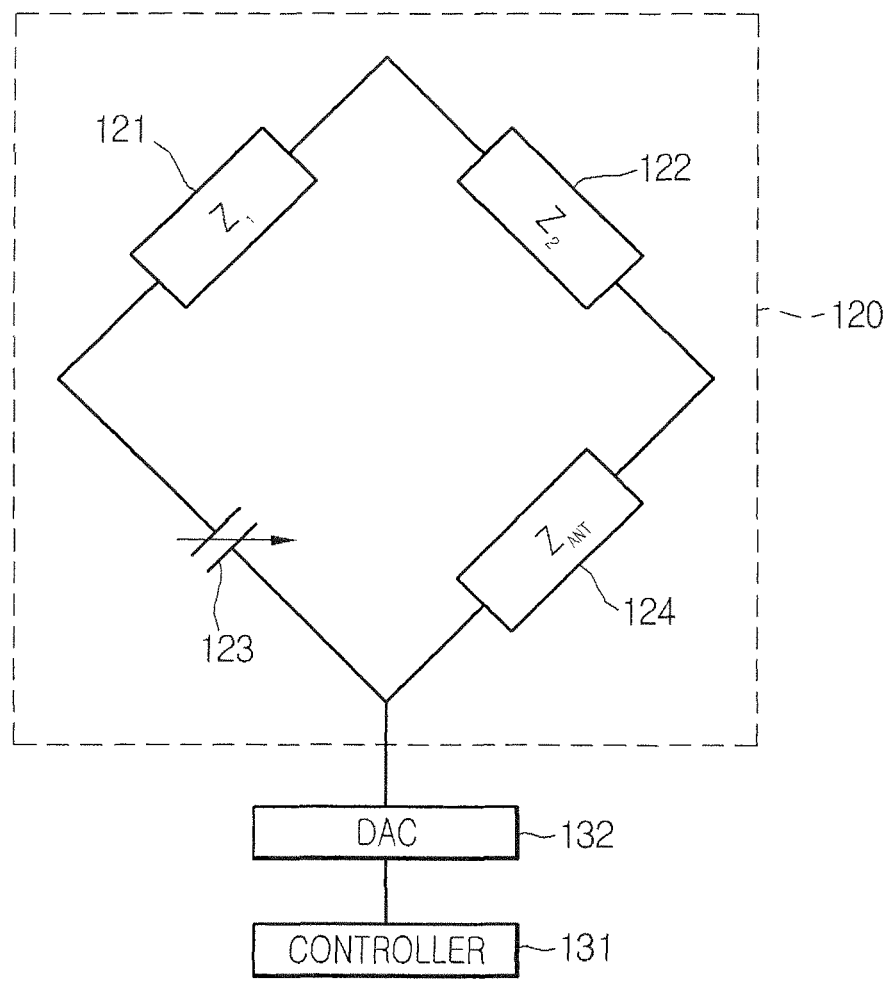
FIG. 4 is a detailed block diagram illustrating an impedance matching unit according to a second embodiment.

FIG. 1 is a block diagram schematically illustrating an impedance matching apparatus according to an embodiment. FIG. 2 is a detailed block diagram illustrating an impedance detection unit of FIG. 1. FIG. 3 is a detailed block diagram illustrating an impedance matching unit according to a first embodiment. FIG. 4 is a detailed block diagram illustrating an impedance matching unit according to a second embodiment.

First Embodiment

Referring to FIGS. 1 to 3, an impedance matching device of an antenna circuit according to a first embodiment includes a signal separation unit 110, an impedance detection unit 120, and an impedance matching unit 130.

The impedance matching device may be built in a body (not shown) that is provided to have a certain outer appearance. The body having the outer appearance may be a wireless communication apparatus using an antenna. For example, the wireless communication apparatus may include a tuner.

The signal separation unit 110 separates an input transmission and reception signal, and selectively passes only a desired frequency corresponding to the transmission and reception signal.

The signal separation unit 110 may include a front end module.

The front end module includes an antenna switching module (ASM) and a surface acoustic wave (SAW) filter. The front end module may selectively pass a desired frequency corresponding to a transmission and reception signal.

The transmission and reception signal may be a radio frequency (RF) transmission and reception signal, but the present disclosure is not limited thereto. For example, the transmission and reception signal may be at least one of an intermediate frequency (IF) transmission and reception signal, a low frequency (LF) transmission and reception signal, a very high frequency (VHF) transmission and reception signal, and an ultra high frequency (UHF) transmission and reception signal.

The impedance detection unit 120 receives a desired frequency, corresponding to a transmission and reception signal that is separated and selectively passed by the signal separation unit 110, to detect an electric between a plurality of impedances Z1 to Z3 and ZANT.

Herein, as illustrated in FIG. 2, the impedances Z1 to Z3 and ZANT may include first to fourth impedances 121 to 124 configuring a Wheatstone bridge circuit, in which case the fourth impedance 124 may be an antenna matching end impedance ZANT.

The impedance detection unit 120 includes first and second detectors 125 and 126.

The first detector 125 is disposed between the first and second impedances 121 and 122, and detects a first electric potential between the first and second impedances 121 and 122.

The second detector 126 is disposed between the third impedance 123 and the antenna matching end impedance 124, and detects a second electric potential between the third impedance 123 and the antenna matching end impedance 124.

That is, the impedance detection unit 120 detects a plurality of impedances, a first electric potential for a first point between the impedances, a second electric potential for a second point between the impedances. The impedance detection unit 120 delivers the detected first and second electric potentials to the impedance matching unit 130.

The impedance matching unit 130 receives the first and second electric potentials from the impedance detection unit 120, compares the received first and second electric potentials, and matches impedances.

For this, as illustrated in FIG. 3, the impedance matching unit 130 includes a controller 131, a digital-to-analog converter (DAC) 132, and an impedance matching circuit 133.

The controller 131 compares the first and second electric potentials to determine whether or not the first and second electric potentials are the same.

When the first and second electric potentials are the same, this is a case where the impedances of the antenna have accurately been matched in an optimal state. When the first and second electric potentials differ, this is a case where an impedance matching factor of the antenna has varied.

Therefore, when the first and second electric potentials are the same, the controller 131 maintains a previous matching factor as-is, but when the first and second electric potentials differ, the controller 131 changes a previous matching factor to a new matching factor.

For this, the controller 131 newly determines a capacitance value for changing the previous matching factor, and allows impedances to be matched by applying the determined capacitance value.

The capacitance value is an equipotential value for changing a difference between the first and second electric potentials to zero, namely, for allowing the first and second electric potentials to have the same value.

The capacitance value determined by the controller 131, namely, the equipotential value is a digital signal, which is delivered to the DAC 132.

The DAC 132 converts the capacitance value, which is supplied from the controller 131 and is used to compensate for a potential difference between the impedances Z1 to Z3 and ZANT, into an analog signal and outputs the converted analog signal.

The impedance matching circuit 133 receives the analog signal supplied from the DAC 132, and matches impedances with the received analog signal.

That is, the impedance matching circuit 133 receives an equipotential value (corresponding to the converted analog signal) between the impedances Z1 to Z3 and ZANT to be compensated for, and controls a voltage to have the equipotential value between the impedances Z1 to Z3 and ZANT, thereby matching impedances. The controlled voltage may be a capacitance value that is applied to at least one variable capacitors VC1 and VC2.

To provide a more detailed description, the impedance matching circuit 133 may include at least one inductors L1 and L2, at least one capacitor C1, and the at least one variable capacitors VC1 and VC2.

Each of the at least one inductors L1 and L2 has one end electrically connected to the impedance detection unit 120, and another grounded end. The at least one inductors L1 and L2 sequentially control an electric potential value (first and second electric potentials) between current impedances, outputted from the impedance detection unit 120.

The at least one inductors L1 and L2 may include a first inductor L1, and a second inductor L2 connected to the first inductor L1 in parallel.

The at least one capacitor C1 is electrically connected to the at least one inductors L1 and L2, and stores the electric potential value between the current impedances that has sequentially been controlled by the at least one inductors L1 and L2.

The at least one capacitor C1 may include only a first capacitor C1. Unlike this, the at least one capacitor C1 may include a plurality of capacitors.

Each of the at least one variable capacitors VC1 and VC2 has one end electrically connected to the impedance detection unit 120 and the at least one inductors L1 and L2, and another grounded end. The at least one variable capacitors VC1 and VC2 may receive the equipotential value (corresponding to the converted analog signal) between the impedances Z1 to Z3 and ZANT to be compensated for, control a voltage to have the received equipotential value between the impedances Z1 to Z3 and ZANT, and supply the controlled voltage to the impedance detection unit 120, thereby matching the impedances Z1 to Z3 and ZANT.

That is, the variable capacitors VC1 and VC2 may match the impedances by applying the capacitance value supplied from the DAC 132.

The variable capacitors VC1 and VC2 may include a first variable capacitor VC1, and a second variable capacitor VC2 connected to the first variable capacitor VC1 in parallel.

As described above, when a difference of the first and second electric potentials between the impedances Z1 to Z3 and ZANT is detected by the impedance detection unit 120, the impedance matching apparatus according to an embodiment monitors the difference, and matches the impedances according to the electric potential difference, thereby maintaining an optimal impedance matching factor.

Second Embodiment

Except the third impedance 123 of the impedance detection unit 120 and the configuration of the impedance matching unit 130, the second embodiment has the same configuration as that of the first embodiment. In describing below the second embodiment, therefore, repetitive description on the same configuration and operation as those of the first embodiment will not be provided.

Referring to FIG. 4, an impedance matching device according to the second embodiment includes a signal separation unit 110, an impedance detection unit 120, and an impedance matching unit 130.

As described above in the first embodiment, the impedance detection unit 120 includes first to fourth impedances 121 and 124. Also, the impedance detection unit 120 includes first and second detectors 125 and 126.

The third impedance 123 according to the second embodiment includes a variable capacitor.

That is, the third impedance 123 does not include a capacitor having a fixed capacitance value but includes a variable capacitor for matching impedances. In FIG. 4, the third impedance 123 is illustrated as configured with the variable capacitor, but the present disclosure is not limited thereto. For example, an impedance other than the third impedance 123 may be configured with a variable capacitor.

The impedance matching unit 130 includes a controller 131 and a DAC 132.

The controller 131 compares a first electric potential detected by the first detector 125 and a second electric potential detected by the second detector 126, and changes a predetermined impedance matching factor according to the compared result of the first and second electric potentials.

That is, when the first and second electric potentials are the same, the controller 131 maintains the predetermined impedance matching factor as-is.

That is, when the first and second electric potentials differ, the controller 131 determines an impedance matching factor for changing a difference between the first and second electric potentials to zero.

The impedance matching factor is an equipotential value for making the first and second electric potentials identical, namely, a capacitance value of the variable capacitor included in the third impedance 123.

That is, as the capacitance value of the variable capacitor included in the third impedance 123 varies, the electric potential is changed.

Therefore, the controller 131 determines the capacitance value of the variable capacitor included in the third impedance 123 for making the first and second electric potentials identical, and allows impedances to be matched by applying the determined capacitance value.

The DAC 132 converts the capacitance value determined by the controller 131 into an analog signal, and supplies the converted analog signal to the third impedance 123.

In this way, the impedance matching apparatus according to the second embodiment may check an impedance matching state in real time using an electric potential difference in a Wheatstone bride circuit. When the matching of impedances is abnormal, the impedance matching apparatus may change the capacitance value of the impedance configuring the Wheatstone bridge circuit to match impedances.

Figure 5:
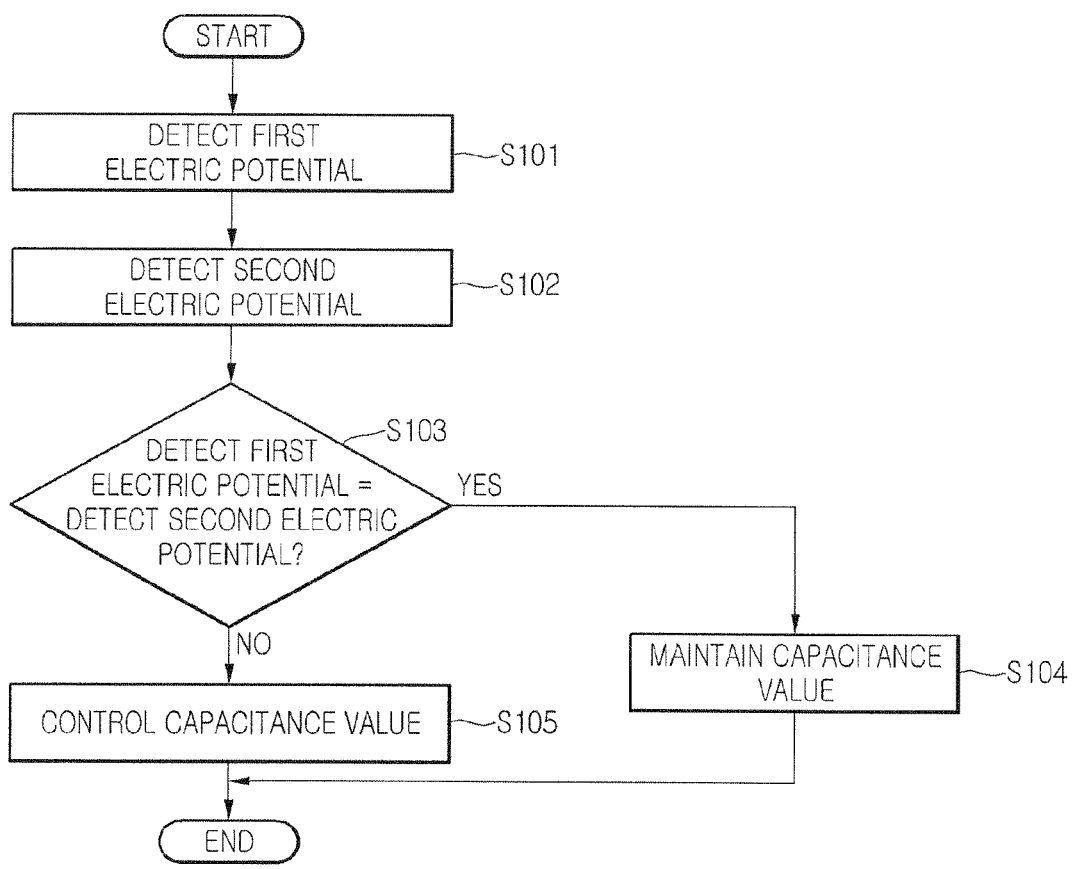
FIG. 5 is a flowchart illustrating an impedance matching method according to an embodiment.

FIG. 5 is a detailed block diagram illustrating an impedance matching method according to an embodiment.

Referring to FIG. 5, the first detector 125 is disposed between the first and second impedances 121 and 122, and detects the electric potential (first electric potential) between the first and second impedances 121 and 122 in operation S101.

Subsequently, the second detector 126 is disposed between the third impedance 123 and the antenna matching end impedance 124, and detects the electric potential (second electric potential) between the third impedance 123 and the antenna matching end impedance 124 in operation S102.

The first electric potential detected by the first detector 125 and the second electric potential detected by the second detector 126 are inputted to the controller 131.

The controller 131 receives and compares the detected first and second electric potentials to determine whether the first and second electric potentials are the same in operation S103.

In other words, the controller 131 checks whether the current impedance of the antenna has optimally been matched or the impedance matching factor of the antenna has varied.

When the first and second electric potentials are equal as the determined result of operation S103, the controller 131 maintains a predetermined impedance matching value as-is in operation S104.

Moreover, when the first and second electric potentials differ as the determined result of operation S103, the controller 131 changes a capacitance value of a capacitor included in the antenna matching circuit 133 and thus allows impedances to be matched in operation S105.

On the other hand, according to the second embodiment, when the first and second electric potentials differ as the determined result of operation S103, the controller 131 changes a capacitance value of the third impedance 123.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An impedance matching apparatus comprising:
    a signal separation unit separating a transmission and reception signal, and selectively passing a desired frequency corresponding to the transmission and reception signal;
    an impedance detection unit comprising a plurality of impedances, and detecting first and second electric potentials between the impedances; and
    an impedance matching unit comparing the first and second electric potentials detected by the impedance detection unit, and changing a matching factor for one of the impedances comprised in the impedance detection unit to match the impedances according to the compared result,
    wherein the impedance detection unit comprises first to fourth impedances configuring a Wheatstone bridge circuit, one of the first to fourth impedances being an antenna matching end impedance.

2. The impedance matching apparatus according to claim 1, wherein,
    the first electric potential is an electric potential between the first and second impedances, and
    the second electric potential is an electric potential between the third and fourth impedances.

3. The impedance matching apparatus according to claim 2, wherein the impedance detection unit further comprises:
    a first detector disposed between the first and second impedances, and detecting the first electric potential; and
    a second detector disposed between the third and fourth impedances, and detecting the second electric potential.

4. The impedance matching apparatus according to claim 1, wherein at least one of the plurality of impedances comprises a variable capacitor.

5. The impedance matching apparatus according to claim 4, wherein the impedance matching unit comprises:
    a controller detecting a difference between the first and second electric potentials, and determining an impedance matching factor corresponding to the detected difference; and
    a digital-to-analog converter (DAC) converting a signal, corresponding to the impedance matching factor determined by the controller, into an analog signal to output the converted analog signal.

6. The impedance matching apparatus of claim 5, wherein the impedance matching factor corresponds to a capacitance value of the variable capacitor.

7. The impedance matching apparatus according to claim 5, wherein the impedance matching factor corresponds to an equipotential value for changing the difference between the first and second electric potentials to zero.

8. The impedance matching apparatus according to claim 1, wherein the transmission and reception signal comprises a radio frequency (RF) transmission and reception signal.

9. The impedance matching apparatus according to claim 1, wherein the impedance matching apparatus is built in a body of a wireless communication terminal comprising a tuner.

10. An impedance matching method comprising:
    detecting a first electric potential between first and second impedances;
    detecting a second electric potential between third and fourth impedances;
    comparing the detected first and second electric potentials; and
    changing an impedance matching factor for one of the first to fourth impedances according to the comparison result,
    wherein the first to fourth impedances configure a Wheatstone bridge circuit, and one of the first to fourth impedances is an antenna matching end impedance.

11. The impedance matching method according to claim 10, wherein at least one of the first to fourth impedances comprises a variable capacitor.

12. The impedance matching method according to claim 11, wherein the changing of an impedance matching factor comprises changing a capacitance value of the variable capacitor for the first and second electric potentials to be equal, when the first and second electric potentials differ.

13. The impedance matching method according to claim 11, further comprising maintaining the impedance matching factor as-is, when the first and second electric potentials are equal.

\* \* \* \* \*